(12) United States Patent
Tsurume et al.

(10) Patent No.: US 8,878,223 B2
(45) Date of Patent: Nov. 4, 2014

(54) LIGHT EMITTING DEVICE AND METHOD FOR MANUFACTURING THEREOF

(75) Inventors: Takuya Tsurume, Kanagawa (JP); Hisao Ikeda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 8 days.

(21) Appl. No.: 13/439,298

(22) Filed: Apr. 4, 2012

(65) Prior Publication Data
US 2012/0256227 A1 Oct. 11, 2012

(30) Foreign Application Priority Data

Apr. 8, 2011 (JP) .................................. 2011-086496

(51) Int. Cl.
*H01L 51/52* (2006.01)
*H01L 51/56* (2006.01)

(52) U.S. Cl.
USPC .......................................................... 257/99

(58) Field of Classification Search
USPC ........... 257/57, 59, 66, 72, 79–103, 359, 390, 257/443, E21.411, E21.412, E51.005, 257/E29.151, E27.1, E29.117; 438/30, 149, 438/158–159
See application file for complete search history.

(56) References Cited

U.S. PATENT DOCUMENTS

| | | | |
|---|---|---|---|
| 6,593,691 B2 | 7/2003 | Nishi et al. | |
| 7,161,184 B2 | 1/2007 | Miyagi et al. | |
| 7,221,095 B2 | 5/2007 | Yamazaki et al. | |
| 7,733,441 B2 | 6/2010 | Seo et al. | |
| 2004/0232830 A1 | 11/2004 | Hieda | |
| 2007/0222380 A1* | 9/2007 | Yamazaki et al. | 313/509 |
| 2010/0045176 A1* | 2/2010 | Kim et al. | 313/504 |
| 2010/0096981 A1 | 4/2010 | Seo et al. | |

FOREIGN PATENT DOCUMENTS

JP 2006-351314 12/2006

* cited by examiner

*Primary Examiner* — Fernando L Toledo
*Assistant Examiner* — Lawrence-Linh T Nguyen
(74) *Attorney, Agent, or Firm* — Husch Blackwell LLP

(57) ABSTRACT

A conductive layer serving as an auxiliary wiring is formed under a first electrode with a first insulating layer interposed therebetween, and the conductive layer and a second electrode are electrically connected to each other through an opening in the first insulating layer and the first electrode. A second insulating layer is formed over a sidewall of the opening so that the first electrode is not directly in contact with the second electrode in the opening. An EL layer is formed by evaporation in a state where a deposition target substrate is inclined to an evaporation source, so that the second insulating layer serves as an obstacle and a region where the EL layer is not formed by the evaporation and the conductive layer is exposed is formed in part of the opening in a self-aligned manner.

24 Claims, 11 Drawing Sheets

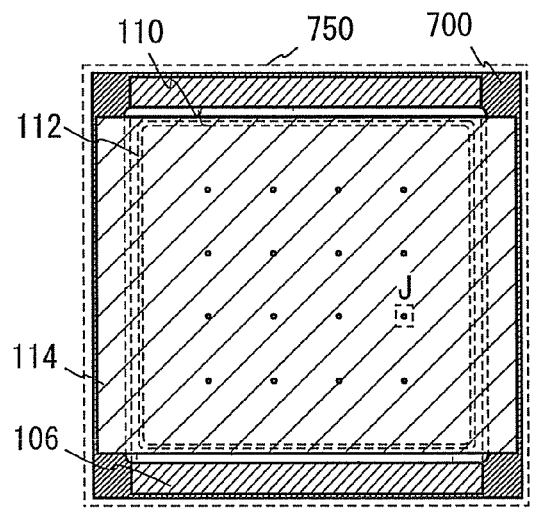
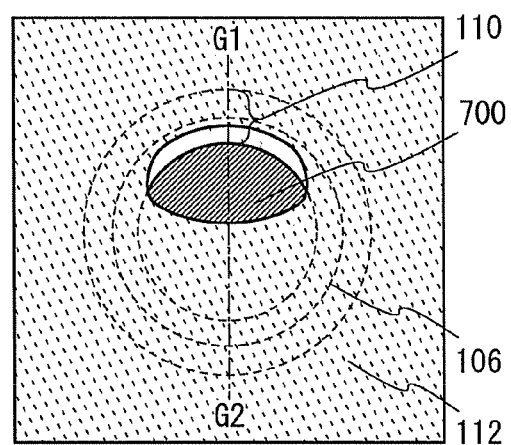
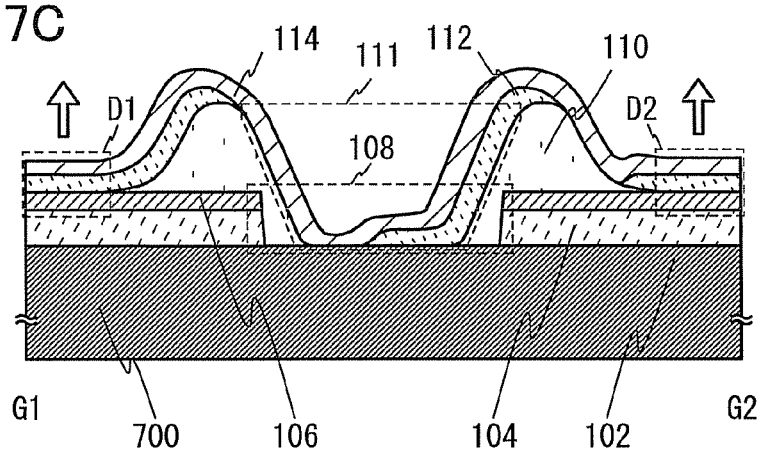

LIGHT EMITTING DEVICE AND METHOD FOR MANUFACTURING THEREOF

BACKGROUND OF THE INVENTION

1. Field of the Invention

The present invention relates to a light-emitting device and a method for manufacturing thereof.

2. Description of the Related Art

Instead of light-emitting devices such as incandescent lamps and fluorescent lamps which have been used for a long time, in recent years, a light-emitting device using an element (hereinafter, abbreviated to an EL element) in which a functional thin film layer (hereinafter, abbreviated to an EL (Electro Luminescence) layer) which emits light by application of current is interposed between electrodes has been actively researched. A light-emitting device including an EL element has advantages that reduction in thickness and weight is easily conducted as compared to conventional light-emitting devices. The light-emitting device can be attached on a curved surface utilizing these advantages.

An example of a structure of the light-emitting device including an EL element is a top emission structure as disclosed in Patent Document 1.

REFERENCE

[Patent Document 1] Japanese Published Patent Application No. 2006-351314

SUMMARY OF THE INVENTION

In a top-emission light-emitting device, a light-transmitting conductive layer is formed for an electrode on a side from which light is emitted outside (corresponding to a cathode in Patent Document 1; in this specification, referred to as a second electrode; on the other hand, an electrode that is on a side opposite to the side from which light is emitted outside is referred to as a first electrode); however, the light-transmitting conductive layer has a high resistance value compared to a metal film. Thus, when the second electrode is formed over a large area, luminance unevenness occurs in a light-emitting surface due to a voltage drop caused by resistance of the light-transmitting conductive layer.

As a method for suppressing the voltage drop, there is a method in which a layer with a low resistance value (referred to as an auxiliary electrode, an auxiliary wiring, or the like; hereinafter referred to as an auxiliary wiring) is formed in contact with the second electrode after the second electrode is formed. For example, a method in which a conductive paste is formed by a printing method to be used as an auxiliary wiring, a method in which a conductive film is formed by a sputtering method with a mask including an opening which has a pattern for a film formation part provided over a substrate and is used as an auxiliary wiring, and the like are given.

When the auxiliary wiring is formed over the second electrode by any of the above-described methods, it is necessary to lead the auxiliary wiring, for example, such that auxiliary wiring is formed in a grid in order to suppress the voltage drop of the entire second electrode. However, emission luminance is decreased in accordance with the formation area of the auxiliary wiring because the auxiliary wiring formed over the second electrode blocks light that is emitted outside from an EL layer.

The present invention has been made in view of the foregoing technical background. Thus, an object of the present invention is to provide a light-emitting device in which generation of luminance unevenness due to a voltage drop and a decrease in emission luminance due to an auxiliary wiring are suppressed. Further, an object of the present invention is to provide a method for manufacturing such a light-emitting device simply and easily.

The present invention aims to achieve at least one of the above-described objects.

In order to achieve the aforementioned objects, in the present invention, a structure is provided in which a conductive layer serving as an auxiliary wiring of a second electrode is placed under a first electrode with a first insulating layer interposed therebetween and the conductive layer is electrically connected to the second electrode through an opening in the first insulating layer and the first electrode. Note that a second insulating layer is provided on a sidewall of the opening so that the first electrode is not directly in contact with the second electrode in the opening.

With the above-described structure, the conductive layer functions as the auxiliary wiring of the second electrode and thus generation of luminance unevenness due to a voltage drop caused by the resistance value of the second electrode is suppressed. Further, the layer serving as the auxiliary wiring is formed under the first electrode and thus a decrease in emission luminance due to the auxiliary wiring which blocks light that is emitted outside from the EL layer is suppressed.

When the above-described light-emitting device is manufactured, an end portion of the second insulating layer is provided over the first electrode so that part of the second insulating layer is formed over the first electrode, and the EL layer is aimed by evaporation in a state where a deposition target substrate is inclined to an evaporation source. Accordingly, the second insulating layer serves as an obstacle (mask), and a region where the EL layer is not formed by the evaporation and the conductive layer is exposed is formed in part of the opening in a self-aligned manner. Thus, the conductive layer and the second electrode can be electrically connected to each other by the formation of the second electrode over the EL layer without a complicated step such as patterning treatment. Therefore, the light-emitting device in which generation of luminance unevenness due to a voltage drop and a decrease in emission luminance due to the auxiliary wiring are suppressed can be manufactured simply and easily.

One embodiment of the present invention is a light-emitting device including a conductive layer over an insulating substrate; a first insulating layer over the conductive layer and a first electrode over the first insulating layer which have a first opening so that the conductive layer is exposed; a second insulating layer which covers a sidewall of the first opening provided in the first insulating layer and the first electrode so as to reach the conductive layer, and has an end portion over the first electrode and a second opening in a portion overlapping with the first opening; an EL layer over the first electrode; and a second electrode over the EL layer, which is electrically connected to the conductive layer through the second opening provided in the second insulating layer and overlapping with the first opening.

In the light-emitting device having a structure according to the above embodiment of the present invention, the conductive layer formed under the first electrode is electrically connected to the second electrode and serves as an auxiliary wiring of the second electrode; thus, generation of luminance unevenness due to a voltage drop caused by the resistance value of the second electrode can be suppressed. Further, the layer serving as the auxiliary wiring is formed under the first electrode and does not absorb or reflect light emitted from the EL layer; thus, a decrease in emission luminance can be suppressed.

Further, one embodiment of the present invention is a light-emitting device including a first insulating layer over a conductive substrate and a first electrode over the first insulating layer which have a first opening so that the conductive substrate is exposed; a second insulating layer which covers a sidewall of the first opening provided in the first insulating layer and the first electrode so as to reach the conductive substrate, and has an end portion over the first electrode and a second opening in a portion overlapping with the first opening; an EL layer over the first electrode; and a second electrode over the EL layer, which is electrically connected to the conductive substrate through the second opening provided in the second insulating layer and overlapping with the first opening.

In the light-emitting device having a structure according to the above embodiment of the present invention, the conductive substrate can be used as the auxiliary wiring of the second electrode and a conductive layer serving as an auxiliary wiring does not need to be formed, so that the light-emitting device can be provided at low cost. Further, the conductive substrate has higher thermal conductivity compared to that of the insulating substrate and easily releases heat in the light-emitting device to the outside; thus, deterioration of the light-emitting device due to a thermal factor can be suppressed.

One embodiment of the present invention is a method for manufacturing a light-emitting device, which includes the steps of forming a deposition target substrate by forming a conductive layer over an insulating substrate; forming a first insulating layer over the conductive layer; forming a first electrode over the first insulating layer so as to overlap with the conductive layer; forming a first opening in the first insulating layer and the first electrode so as to reach the conductive layer; forming a second insulating layer covering a sidewall of the first opening and having an end portion over the first electrode; and forming a second opening in the second insulating layer so as to reach the conductive layer and overlap with the first opening; the step of forming an EL layer by evaporation in an evaporation chamber provided with an evaporation source in a state where the deposition target substrate is inclined to the evaporation source so that a region where the EL layer is not formed by evaporation by being blocked by the second insulating layer is formed over part of the conductive layer overlapping with the second opening; and the step of forming a second electrode over the EL layer so as to be electrically connected to the conductive layer overlapping with the second opening.

By using the manufacturing method according to the above embodiment of the present invention, in the step of forming the EL layer, the region where the EL layer is not formed is formed over part of the conductive layer in the second opening in a self-aligned manner with the second insulating layer serving as an obstacle and then the conductive layer and the second electrode are electrically connected to each other in this region by the formation of the second electrode. Therefore, the light-emitting device in which generation of luminance unevenness due to a voltage drop and a decrease in emission luminance are suppressed can be manufactured simply and easily.

Further, one embodiment of the present invention is a method for manufacturing a light-emitting device, which includes the steps of forming a deposition target substrate by forming a first insulating layer over a conductive substrate; forming a first electrode over the first insulating layer so as to overlap with the conductive substrate; forming a first opening in the first insulating layer and the first electrode so as to reach the conductive substrate; forming a second insulating layer covering a sidewall of the first opening and having an end portion over the first electrode; and forming a second opening in the second insulating layer so as to reach the conductive substrate and overlap with the first opening; the step of forming an EL layer by evaporation in an evaporation chamber provided with an evaporation source in a state where the deposition target substrate is inclined to the evaporation source so that a region where the EL layer is not formed by evaporation by being blocked by the second insulating layer is formed over part of the conductive substrate overlapping with the second opening; and the step of forming a second electrode over the EL layer so as to be electrically connected to the conductive substrate overlapping with the second opening.

By using the manufacturing method according to the above embodiment of the present invention, in the step of forming the EL layer, the region where the EL layer is not formed is formed over part of the conductive substrate in the second opening in a self-aligned manner with the second insulating layer serving as an obstacle and then the conductive substrate and the second electrode are electrically connected to each other in this region by the formation of the second electrode. Further, the conductive substrate has higher thermal conductivity and easily releases heat in the light-emitting device to the outside; thus, deterioration of the light-emitting device due to a thermal factor can be suppressed. Therefore, the light-emitting device in which a decrease in emission luminance, generation of luminance unevenness due to a voltage drop, and deterioration of the EL layer caused by heat generation are suppressed can be manufactured simply and easily.

When the expression "B is formed over A" or "B is formed on A" is explicitly described in this specification, etc., the expression is not limited to the fact that B is formed in direct contact with A. The expression includes the case where A and B are not in direct contact with each other, i.e., the case where another object is interposed between A and B.

Therefore, for example, when the expression that a layer B is formed on or over a layer A is explicitly described, the expression is intended to include both cases where the layer B is formed in direct contact with the layer A, and cases where another layer (e.g., a layer C or a layer D) is formed in direct contact with the layer A and the layer B is formed in direct contact with the other layer. Note that another layer (e.g., a layer C or a layer D) may be a single layer or a plurality of layers.

Note that the same can be said for the expression "B is formed under A".

When the expression "A and B are formed in this order" is explicitly described in this specification and the like, the expression is not limited to the fact that B is formed just after A is formed. The expression includes the case where another object is formed between formation of A and B.

Therefore, for example, when the expression that a layer A and a layer B are formed in this order is explicitly described, the expression is intended to include both the case where the layer B is formed just after the layer A is formed, and the case where another layer (e.g., a layer C) is formed after the layer A is formed, and then the layer B is formed.

Note that in this specification and the like, an ordinal number such as "first" or "second" is given for convenience to distinguish elements, and is not given to limit the number, arrangement, and the order of steps. Further, in this specification, steps in which films, layers, materials, substrates, and the like are formed over two substrates are described; therefore, different reference numerals are used for the same films, layers, materials, and substrates in some cases.

According to one embodiment of the present invention, a light-emitting device in which generation of luminance unevenness due to a voltage drop and a decrease in emission luminance due to an auxiliary wiring are suppressed can be provided.

Further, according to one embodiment of the present invention, an EL layer is formed by evaporation in a state where a deposition target substrate is inclined to an evaporation source, so that a second insulating layer has an effect as an obstacle (mask). Accordingly, a light-emitting device in which luminance unevenness due to a voltage drop and decrease in emission luminance are suppressed can be manufactured simply and easily.

BRIEF DESCRIPTION OF THE DRAWINGS

FIGS. 7A to 7C illustrate a structure of a light-emitting device described in Embodiment 2.

DETAILED DESCRIPTION OF THE INVENTION

Figure 1A:
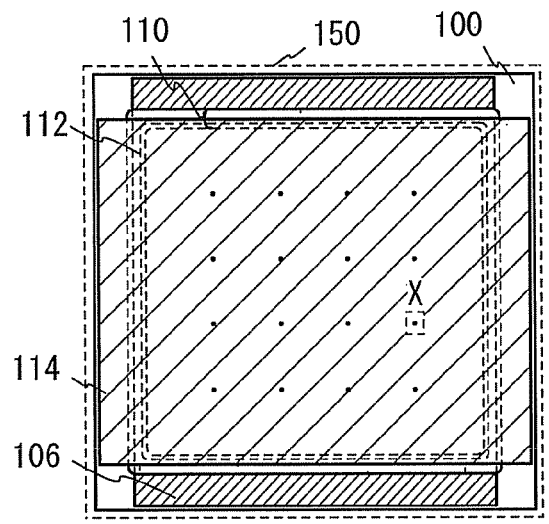
FIGS. 1A to 1C illustrate a structure of a light-emitting device described in Embodiment 1.

Embodiment will be described in detail with reference to drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Embodiment 1

In this embodiment, a light-emitting device and a method for manufacturing the light-emitting device according to one embodiment of the disclosed invention is described with reference to FIGS. 1A to 1C, FIGS. 2A to 2D, FIG. 3, FIGS. 4A and 4B, FIGS. 5A and 5B, FIGS. 6A and 6B, and FIGS. 11A and 11B.

<Structure of Light-Emitting Device in this Embodiment>

Figure 1B:
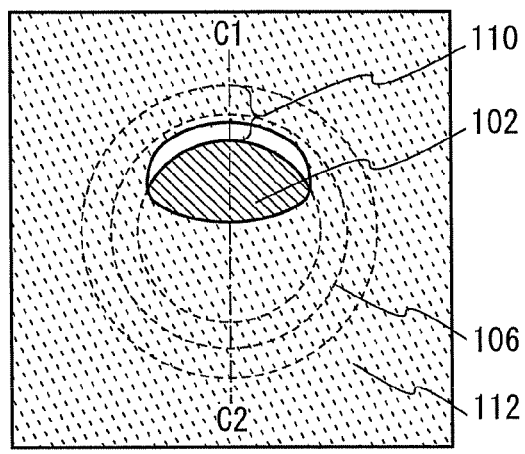
Figure 1C:
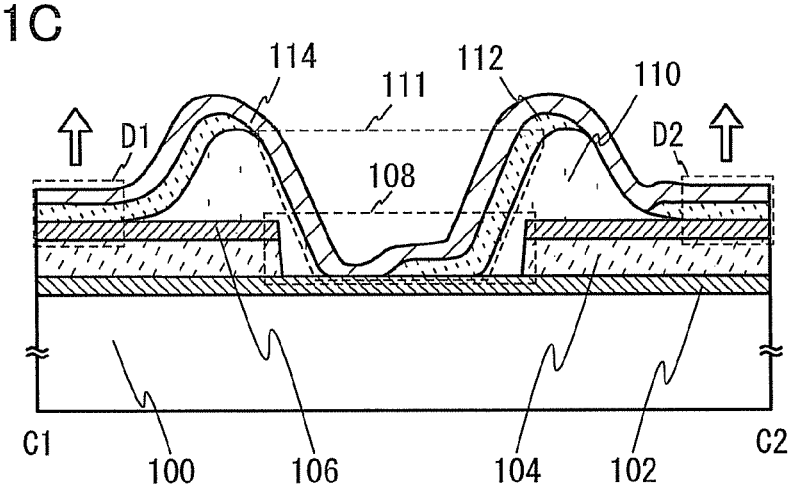

FIGS. 1A to 1C illustrate a top-emission light-emitting device that is an example of a light-emitting device of this embodiment. FIG. 1A is a top view of a light-emitting device 150 and FIG. 1B is an enlarged view of a portion X squarely surrounded by a dotted line in FIG. 1A. In FIG. 1B, some of components are omitted to avoid complexity.

FIG. 1C is a cross-sectional view of the light-emitting device 150 taken along dashed-dotted line C1-C2 in FIG. 1B.

In the top-emission light-emitting device 150 described in this embodiment, as illustrated in FIG. 1C, a conductive layer 102 serving as an auxiliary wiring is provided under a first electrode 106 serving as an anode with a first insulating layer 104 interposed therebetween, and a first opening 108 which reaches the conductive layer 102 is formed in part of the first insulating layer 104 and the first electrode 106. Further, a second insulating layer 110 which covers a sidewall of the first opening 108 and has an end portion over the first electrode 106 and a second opening 111 in a portion overlapping with the first opening 108 is provided over the conductive layer 102 and the first electrode 106. Further, an EL layer 112 is provided over the first electrode 106 and a second electrode 114 serving as a cathode is electrically connected to the conductive layer 102 through the second opening 111.

An external power source (not illustrated) is connected to the first electrode 106 and the second electrode 114 to supply carriers to the EL layer 112, so that the EL layer 112 can emit light. In the light-emitting device of this embodiment, the conductive layer 102 is formed under the first electrode 106; in other words, the conductive layer 102 is formed on the side opposite to the side from which light is extracted; thus, light emission from a light-emitting region of the EL layer 112 (corresponding to portions D1 and D2 squarely surrounded by dotted lines in FIG. 1C) is not hindered by the conductive layer 102.

Note that the second insulating layer 110 which covers the sidewall of the first opening 108 prevents the second electrode 114 and the first electrode 106 from being in contact with each other. Further, the second insulating layer 110 also has a function as a mask to determine a region where the EL layer 112 is to be formed and a region where the EL layer 112 is not to be formed. This function as a mask will be described later.

The portion where the second insulating layer 110 is formed is a region which does not contribute to light emission. A decrease in a light emission area can be minimized because there is no need to form the second insulating layer 110 linearly (e.g., forming the second insulating layer 110 in a grid) over the entire surface of the substrate like a general auxiliary wiring and the resistance value of the second electrode can be reduced even in the case where the second insulating layer 110 is fowled with an extremely small dot shape as illustrated in FIG. 1A.

In FIGS. 1A to 1C, the EL layer 112 is illustrated as a single layer; however, the EL layer 112 includes at least a light-emitting layer containing a light-emitting organic compound, and may have a single layer structure or a stacked structure. As a stacked structure, for example, a layer containing a substance having a high electron transport property, a layer containing a substance having a high hole-transport property, a layer containing a substance having a high electron injection property, a layer containing a substance having a high hole-injection property, a layer containing a bipolar substance (a substance having a high electron transport property and a high hole-transport property), and the like can be combined as appropriate. Structure examples of the organic EL layer 112 will be described in detail in Embodiment 3.

<Method for Manufacturing Light-Emitting Device in this Embodiment>

A method for manufacturing a light-emitting device is described below with reference to FIGS. 2A to 2D, FIG. 3, FIGS. 4A and 4B, FIGS. 5A and 5B, FIGS. 6A and 6B, and FIGS. 11A and 11B.

Figure 2A:
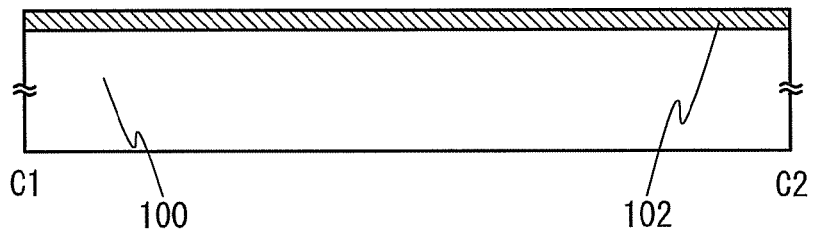
FIGS. 2A to 2D illustrate a method for manufacturing the light-emitting device described in Embodiment 1.

First, an insulating substrate 100 is prepared, and a conductive layer 102 is formed over the insulating substrate 100 (see FIG. 2A).

As the insulating substrate 100, any of the following can be used, for example, various glass substrates formed of soda-lime glass, clear flat glass, lead glass, tempered glass, and ceramic glass, non-alkali glass substrates formed of aluminosilicate glass, aluminoborosilicate glass, and barium borosilicate glass. Such a glass substrate is suitable for increasing in size, and glass substrates of G10 size (2850 mm×3050 mm), G11 size (3000 mm×3320 mm), and the like have been manufactured; thus, the light-emitting device according to one embodiment of the present invention can be mass-produced at low cost. Alternatively, an insulating substrate formed using an insulator, such as a quartz substrate or a sapphire substrate, or a semiconductor substrate formed using a semiconductor material such as silicon whose surface is covered with an insulating material can be used.

As the insulating substrate 100, any of a variety of plastic substrates formed of an ethylene vinyl acetate (EVA) resin, a polyethylene terephthalate (PET) resin, a polyether sulfone (PES) resin, a polyethylene naphthalate (PEN) resin, a polyvinyl alcohol (PVA) resin, a polycarbonate (PC) resin, a polyethylene (PE) resin, an ABS resin, and the like can also be used. Note that in the case where the above plastic substrate is used as the insulating substrate 100, a single layer or a stacked layer of a film having low water vapor permeability of silicon oxide, silicon nitride, silicon oxynitride, silicon nitride oxide, aluminum oxide, or the like is preferably formed on its surface. Thus, deterioration of the EL layer 112 which is to be formed in a later step can be suppressed because the plastic substrate has a high water vapor barrier property.

With the use of the above plastic substrate as the insulating substrate 100, the light-emitting device 150 can be reduced in thickness and weight; further, with the use of the above plastic substrate also as a sealing substrate which is to be used in a later step, the light-emitting device 150 can have flexibility, so that the light-emitting device 150 can have a higher added value.

Although there is no particular limitation on the thickness of the insulating substrate 100, it is preferable that the thickness of the insulating substrate 100 be less than or equal to 3 mm, further preferably less than or equal to 1 mm for a reduction in thickness and weight of the light-emitting device.

As an example, an aluminosilicate glass substrate with a thickness of 0.7 mm may be used as the insulating substrate 100.

Although not formed in this embodiment, a base layer may be formed over the insulating substrate 100 so as to prevent diffusion of an impurity from the insulating substrate 100. As the base layer, silicon oxide ($SiO_2$), silicon nitride (SiN), silicon oxynitride (SiON), silicon nitride oxide (SiNO), aluminum oxide ($AlO_2$), aluminum nitride (AlN), aluminum oxynitride (AlON), aluminum nitride oxide (AlNO), or the like may be formed by a known method, e.g., a CVD method such as a plasma CVD method, or a PVD method such as a sputtering method. The base layer may have a single-layer structure or a stacked structure. In the case of a stacked structure, the above films may be stacked to form the base layer.

Note that in the above description, the terms "oxynitride" and "nitride oxide" are used. They represent which of the content of oxygen and the content of nitrogen contained in a formed layer is large, and "oxynitride" means that the layer contains more oxygen than nitrogen The conductive layer 102 is a layer serving as an auxiliary wiring of the second electrode 114 which is to be formed in a later step. The conductive layer 102 can be formed in such a manner that a conductive layer is formed by a known method, e.g., a variety of evaporation methods such as a vacuum evaporation method, or a sputtering method and selectively removed by a known method, e.g., a dry etching method or a wet etching method using a resist mask. As the conductive layer, for example, a single layer or a stacked layer of any of metal materials such as aluminum, nickel, tungsten, chromium, molybdenum, cobalt, magnesium, titanium, palladium, gold, platinum, silver, and copper or an alloy containing any of these metal materials can be used.

As an example, a layer of an alloy of aluminum and titanium with a thickness of 100 nm and a layer of titanium with a thickness of 10 nm are fainted in this order over the insulating substrate 100 (over the base layer when the base layer is formed over the insulating substrate 100) by a sputtering method, and then patterning treatment is performed by a dry etching method using a resist mask to form the conductive layer 102. The layer of titanium with a thickness of 10 nm is formed as a surface layer of the conductive layer 102, so that formation of an insulating film between the second electrode which is to be formed later and the conductive layer 102 can be suppressed. As such a film which suppresses the formation of an insulating film, molybdenum can be used other than titanium.

Figure 2B:
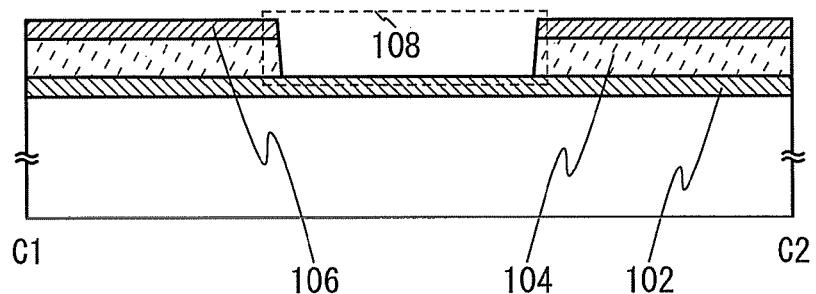
Figure 2C:
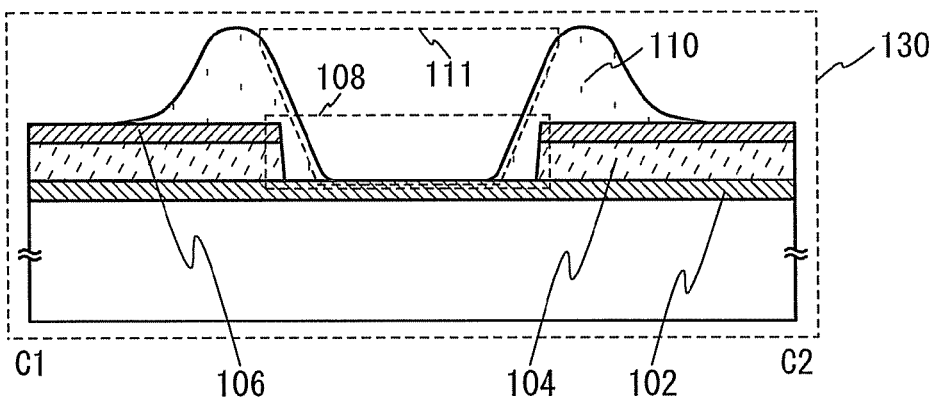

Next, the first insulating layer 104 and the first electrode 106 are formed over the insulating substrate 100 and the conductive layer 102, and the first opening 108 is formed in the first insulating layer 104 and the first electrode 106 (see FIG. 2B).

The first insulating layer 104 serves to keep insulation between the conductive layer 102 and the first electrode 106, and is formed using an insulating inorganic layer by a known method, e.g., a CVD method such as a plasma CVD method, or a PVD method such as a sputtering method. As the insulating inorganic layer, for example, a single-layer structure or a stacked structure of silicon oxide ($SiO_2$), silicon nitride (SiN), silicon oxynitride (SiON), silicon nitride oxide (SiNO), aluminum oxide ($AlO_2$), aluminum nitride (AlN), aluminum oxynitride (AlON), aluminum nitride oxide (AlNO), or the like may be used.

The first insulating layer 104 can be formed in such a manner that an insulating organic resin layer is applied by a known method, e.g., a spin coating method, a printing method, a dispensing method, or an inkjet method and cure treatment (e.g., heat treatment or light irradiation treatment) is performed as appropriate. As the insulating organic resin layer, for example, an organic resin such as an acrylic resin, a polyimide resin, a polyamide resin, a polyamide-imide resin, or an epoxy resin can be used The first electrode 106 may be formed of the same material and by the same method as those of the conductive layer 102.

A resist mask is formed over the first electrode 106 by a photolithography method, a printing method, an inkjet method, or the like, and then part of the first electrode 106 and the first insulating layer 104 are selectively removed using the resist mask, whereby the first opening 108 is formed.

As an example, a layer of silicon oxide with a thickness of 150 nm is formed over the conductive layer 102 by a plasma CVD method, and a layer of an alloy of aluminum and titanium with a thickness of 100 nm and a layer of titanium with a thickness of 10 nm are formed in this order over the layer of silicon oxide by a sputtering method. After that, a resist mask is formed over the first electrode 106; then, part of the layer of titanium, the layer of alloy of aluminum and titanium, and the layer of silicon oxide are selectively removed by a dry etching method using the resist mask, whereby the first insulating layer 104, the first electrode 106, and the first opening 108 are formed.

Note that although the case where the first insulating layer 104 and the first electrode 106 are formed successively and then collectively subjected to opening treatment is described in this embodiment, the first insulating layer 104 and the first electrode 106 may be subjected to opening treatment separately to form the first opening 108 such that the first opening treatment is performed after the first insulating layer 104 is formed and the second opening treatment is performed after the first electrode 106 is formed over the first insulating layer 104.

FIG. 2B shows the case where the side surfaces of the first insulating layer 104 and the first electrode 106 form a continuous surface without unevenness; however, the structure is not limited thereto. For example, the side surfaces of the first insulating layer 104 and the first electrode 106 may have a step shape where the side surface of the first insulating layer 104 extends beyond the side surface of the first electrode 106 toward the center of the first opening 108.

Next, the second insulating layer 110 which covers the sidewall of the first opening 108 and has the end portion over the first electrode 106 and the second opening 111 in the portion overlapping with the first opening 108 is formed over the conductive layer 102 and the first electrode 106. Accordingly, a deposition target substrate 130 is fabricated (see FIG. 2C).

The second insulating layer 110 serves to keep insulation between the first electrode 106 and the second electrode 114 which is to be formed in a later step, and also serves as a mask so that the EL layer 112 is not formed over part of the conductive layer 102 which is exposed in the second opening 111 when the EL layer 112 is formed over the deposition target substrate 130. The second insulating layer 110 can be formed in such a manner that an insulating organic resin layer is applied by a known method, e.g., a spin coating method and is subjected to cure treatment (e.g., heat treatment or light irradiation treatment) as appropriate and then selectively removed by a known etching method such as a dry etching method or a wet etching method using a resist mask. For the insulating organic resin layer, an organic resin such as an acrylic resin, a polyimide resin, a polyamide resin, a polyamide-imide resin, or an epoxy resin can be used, for example. Note that when the second insulating layer 110 is formed by a printing method, a dispenser method, or an inkjet method, the insulating organic resin can be applied to a predetermined position; thus, it is not necessary to remove the resin selectively. A method for forming the second insulating layer 110 may be determined as appropriate by a practitioner in accordance with the size of the second opening 111.

As an example, the second insulating layer 110 may be formed as follows: after a polyimide resin is applied to the conductive layer 102 and the first electrode 106 by a spin coating method, a resist mask is formed over the polyimide resin by a photolithography method, and then part of the polyimide resin is removed by a dry etching method to form the second opening 111.

Here, the function of the second insulating layer 110 as a mask is described with reference to FIGS. 4A and 4B, and FIGS. 5A and 5B.

Figure 4A:
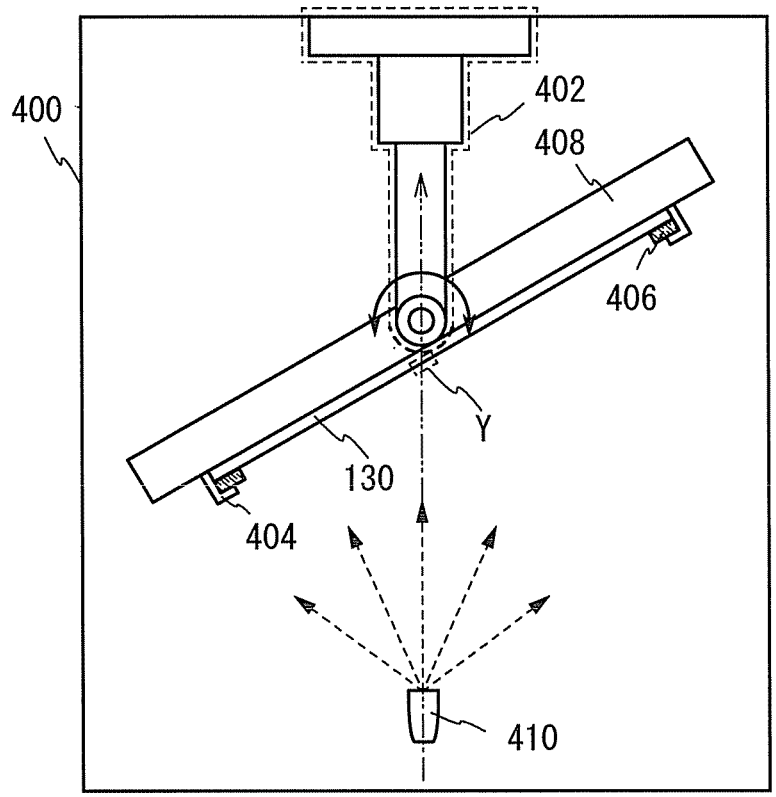
FIGS. 4A and 4B illustrate a method for manufacturing the light-emitting device described in Embodiment 1.

First, the deposition target substrate 130 fabricated by the above steps is put in an evaporation chamber 400 provided with an evaporation source 410 and is fixed to a stage 408 using a substrate fixing mechanism 404 as illustrated in FIG. 4A. Note that a cover material 406 may be provided between the deposition target substrate 130 and the substrate fixing mechanism 404 so that the EL layer 112 is not formed by evaporation in a region which does not contribute to light emission; that is, in a portion where the EL layer 112 does not need to be formed, such as the vicinity of the peripheral portion of the deposition target substrate 130. Then, various materials for forming the EL layer 112 are evaporated in a state where the deposition target substrate 130 is inclined to the evaporation source 410 using an angle adjustment mechanism 402.

As the evaporation source 410, an evaporation source which diffuses a material from one point (also referred to as a point evaporation source), such as a Knudsen cell, a metal boat, or a crucible can be used. Further, an evaporation source which diffuses a material from a portion with a large width, such as a linear source (also referred to as a linear evaporation source) can also be used. Note that only one evaporation source 410 may be provided as illustrated in FIG. 4A, or a plurality of evaporation sources 410 may be provided.

Figure 11A:
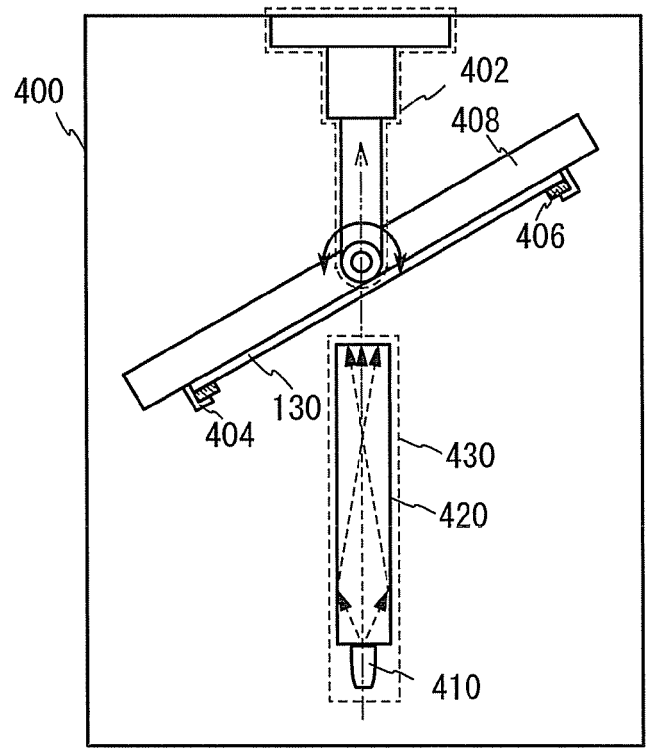
FIGS. 11A and 11B each illustrate a method for manufacturing the light-emitting device described in Embodiment 1.

When the point evaporation source or the linear evaporation source is used as the evaporation source 410, as illustrated in FIG. 11A, various materials for forming the EL layer 112 may be evaporated onto the deposition target substrate 130 in such a manner that an evaporation mechanism 430 provided with a heatable cylindrical wall 420 over the evaporation source 410 is used and is moved. When the heatable cylindrical wall 420 is not provided, a material set in the evaporation source 410 is diffused over a wide range in the evaporation chamber 400; on the other hand, when the heatable cylindrical wall 420 is provided over the evaporation source 410, a material set in the evaporation source 410 proceeds toward the deposition target substrate 130 with high directivity because a diffusing direction of the diffused material is changed by the heatable cylindrical wall 420. Thus, the region where the EL layer 112 is not formed can be easily formed over part of the conductive layer 102 which is exposed in the second opening 111 with the use of the second insulating layer 110.

When the point evaporation source or the linear evaporation source is used as the evaporation source 410, it is preferable that the distance between the evaporation source 410 and the deposition target substrate 130 be at least longer than the long side of the deposition target substrate (e.g., when the deposition target substrate is rectangle of X cm×Y cm, the distance between the evaporation source 410 and the deposition target substrate 130 is preferably Y cm or more).

Figure 11B:
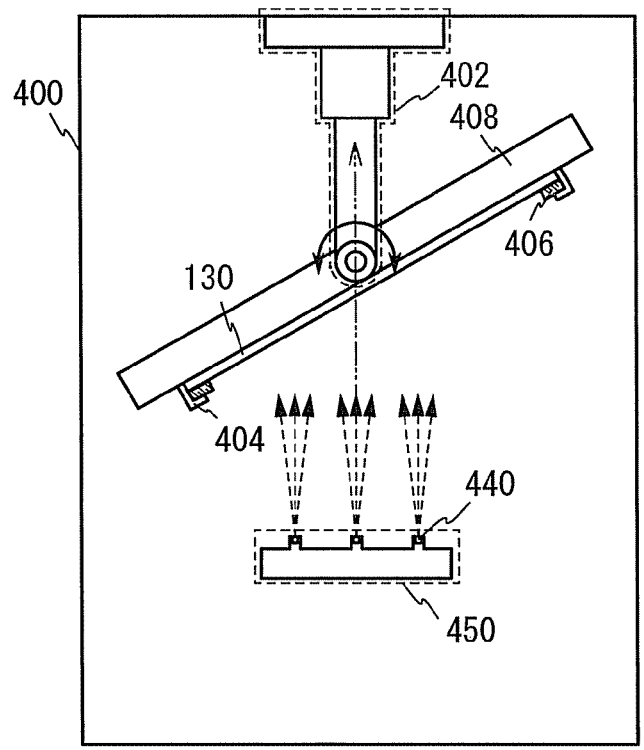

Further, as illustrated in FIG. 11B, an evaporation mechanism 450 which diffuses a pre-vaporized material for the EL layer 112 from an opening 440 can be used. Note that when the evaporation mechanism 450 is used, the material diffused from the evaporation source can have high directivity as well as the evaporation mechanism 430 by making the shape of the opening 440 small.

Although how various materials for forming the EL layer 112 are diffused depends on what kind of evaporation source (or evaporation mechanism) is used. In this embodiment, as an evaporation source, the evaporation source 410 (a so-called point evaporation source) using one crucible is described as an example.

The material set in the evaporation source 410 is diffused over a wide range in the evaporation chamber as indicated by dashed arrows in FIG. 4A by heating the evaporation source 410. Here, a formation state of the EL layer 112 in the range of a section Y squarely surrounded by a dashed line in the deposition target substrate 130 is described with reference to FIG. 4B. In the range of the section Y squarely surrounded by a dashed line, the material diffused from the evaporation source 410 is evaporated onto the deposition target substrate 130 basically along an alternate long and two short dashed line arrow in FIGS. 4A and 4B.

Figure 4B:
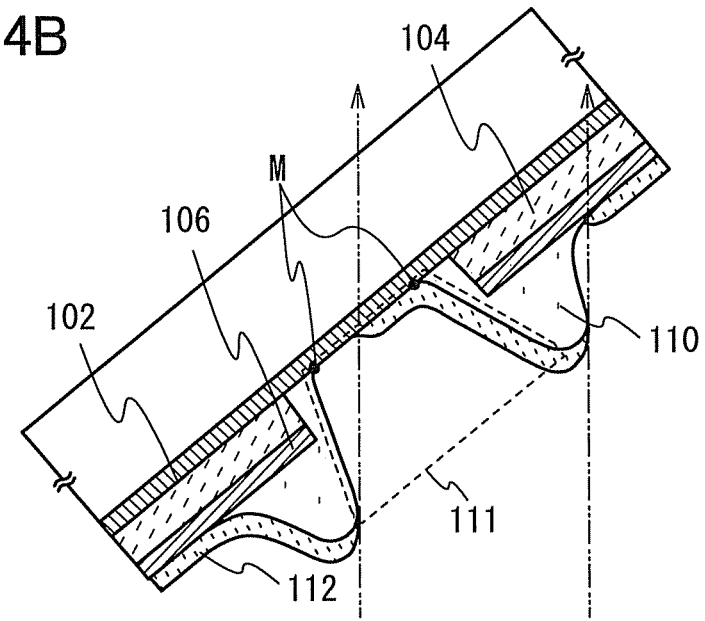

When various materials for forming the EL layer 112 are evaporated in a state where the deposition target substrate 130 is inclined to the evaporation source 410, the various materials are partially blocked by the second insulating layer 110 and a region where the EL layer 112 is not formed and the conductive layer 102 is exposed is formed over the part of the conductive layer 102 overlapping with the second opening 111 in a self-aligned manner as shown in FIG. 4B. Thus, when the second electrode 114 is formed in a later step, the second electrode 114 is in contact with the exposed portion of conductive layer 102, and the conductive layer 102 and the second electrode 114 are electrically connected to each other.

Figure 5A:
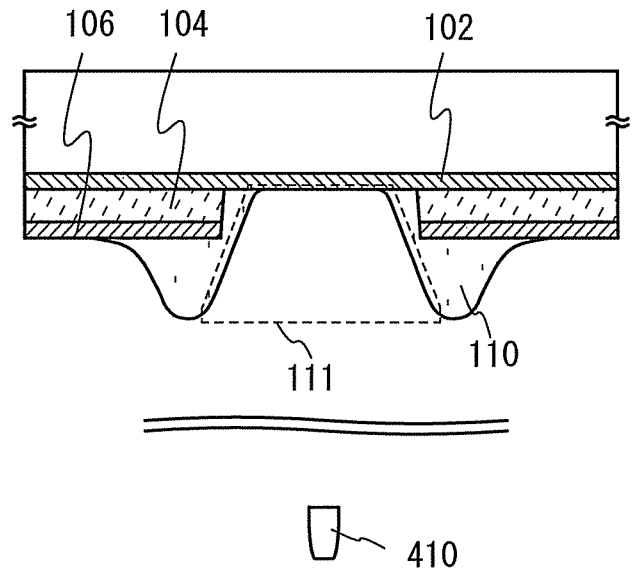
FIGS. 5A and 5B illustrate a method for manufacturing the light-emitting device described in Embodiment 1.
Figure 5B:
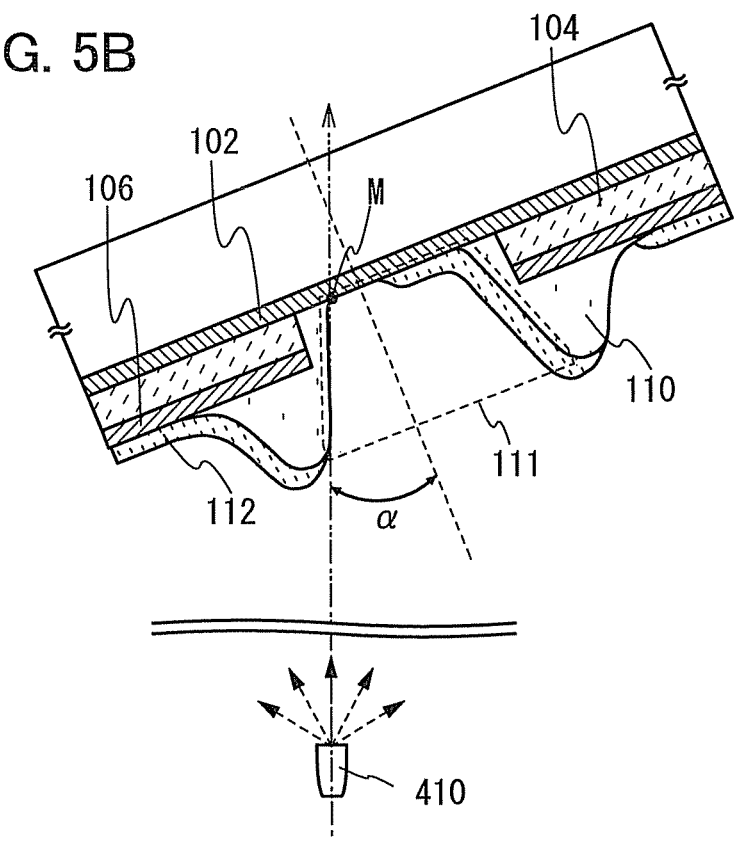

How to incline the deposition target substrate 130 to the evaporation source 410 is described in detail. It is desirable that the deposition target substrate 130 be inclined to the evaporation source 410 so that a line connecting the evaporation source 410 and an end portion of the second insulating layer 110 being in contact with the conductive layer 102 (a black circle indicated by M in FIG. 4B) passes through the second insulating layer 110. For example, when the deposition target substrate 130 is provided so as to be perpendicular to a vertical direction as illustrated in FIG. 5A, various materials for forming the EL layer 112 may be evaporated onto the deposition target substrate 130 in a state where the deposition target substrate 130 is inclined, using the angle adjustment mechanism 402 illustrated in FIG. 4A, at an angle represented by a (that is, an angle at which the line connecting the end portion of the second insulating layer 110 being in contact with the conductive layer 102 (the black circle indicated by M) and the evaporation source 410 is tangential to the second insulating layer 110) or more as illustrated in FIG. 6B.

Figure 6A:
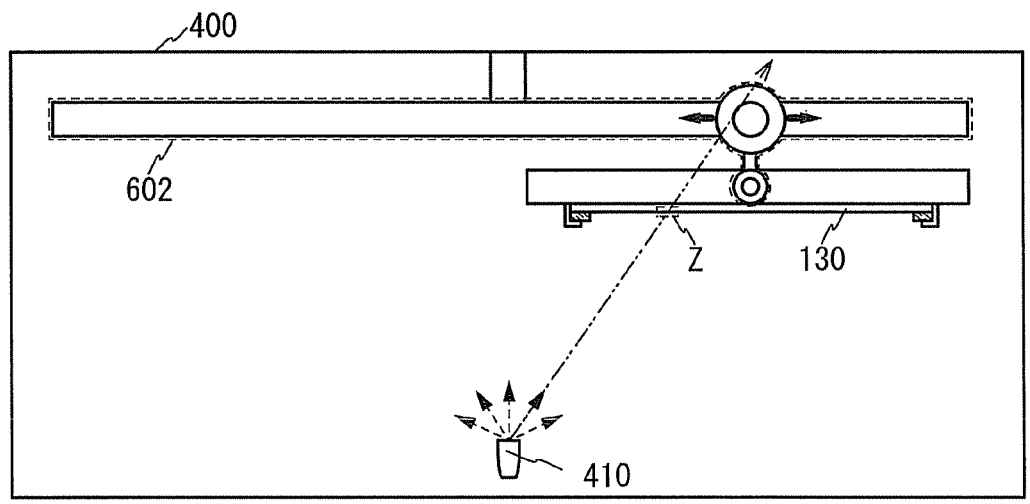
FIGS. 6A and 6B illustrate a method for manufacturing the light-emitting device described in Embodiment 1.
Figure 6B:
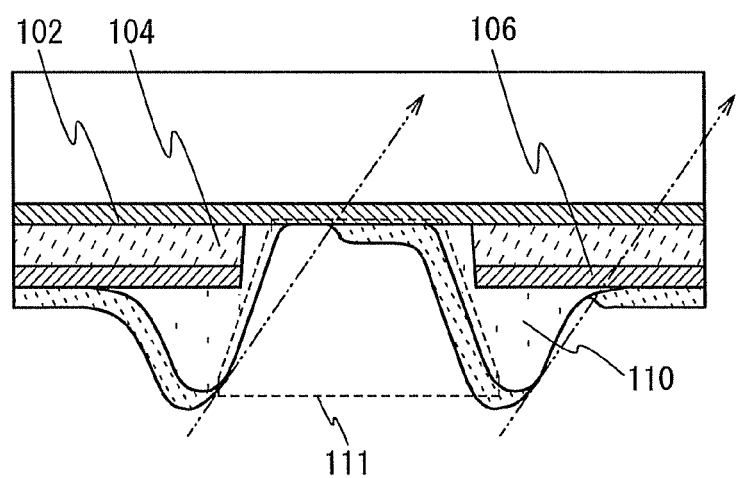

Although the method is described in which the EL layer 112 is formed in a state where the deposition target substrate 130 is inclined to the evaporation source 410 using the angle adjustment mechanism 402 in each of FIGS. 4A and 4B and FIGS. 5A and 5B, the EL layer 112 may be formed in a state where the deposition target substrate 130 is inclined to the evaporation source 410 by shifting the position of the deposition target substrate 130 from the evaporation source 410 using a position adjustment mechanism 602 (with which the deposition target substrate 130 moves in a surface direction perpendicular to the vertical direction) as illustrated in FIG. 6A. FIG. 6B illustrates a formation state of the EL layer 112 in the range of a section Z squarely surrounded by a dashed line in FIG. 6A, in which a material diffused from the evaporation source 410 basically along an alternate long and two short dashed line arrow is partially blocked by the second insulating layer 110, so that a region where the EL layer 112 is not formed and the conductive layer 102 is exposed is formed over the part of the conductive layer 102 overlapping with the second opening 111 in a self-aligned manner similarly to FIG. 5B.

The evaporation source 410 is provided in a vertical direction in each of FIGS. 4A and 4B, FIGS. 5A and 5B, and FIGS. 6A and 6B; however, the structure is not limited thereto, and the evaporation source 410 may be provided while being inclined.

Figure 2D:
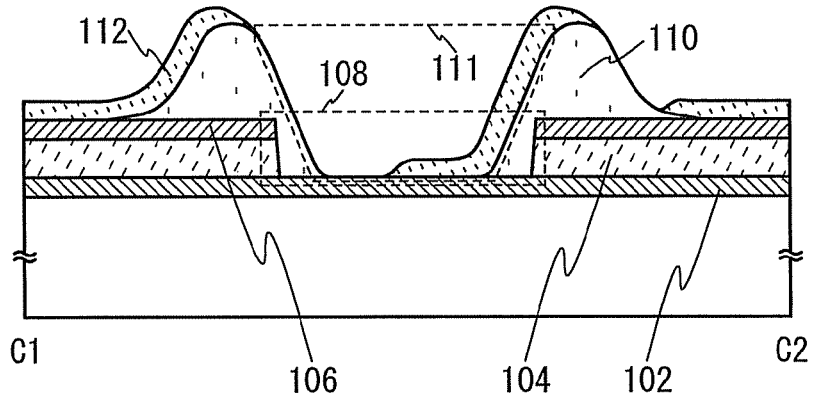

As described above, various materials for forming the EL layer 112 are evaporated in a state where the deposition target substrate 130 is inclined to the evaporation source 410, so that the EL layer 112 can be formed in a self-aligned manner while the conductive layer 102 is exposed in part of the second opening 111 (see FIG. 2D).

Note that structures and materials of the EL layer 112 will be described in detail in Embodiment 3; thus, description is omitted here.

Figure 3:
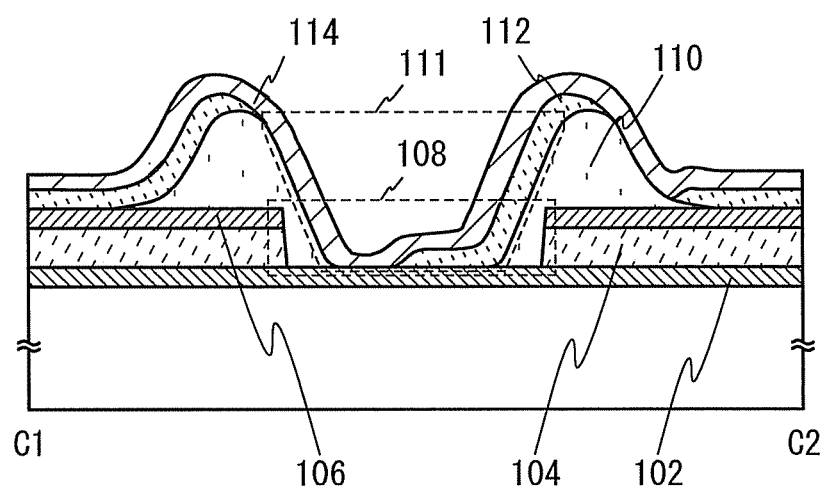
FIG. 3 illustrates a method for manufacturing the light-emitting device described in Embodiment 1.

Next, the second electrode 114 is formed over the EL layer 112 (see FIG. 3). Because a region where the conductive layer 102 is exposed is formed in part of the second opening 111 in a self-aligned manner as described above, the conductive layer 102 and the second electrode 114 can be electrically connected to each other in a simple step without a complicated step such as patterning treatment by the formation of the second electrode 114. Accordingly, the conductive layer 102 functions as an auxiliary wiring of the second electrode 114, so that the resistance value of the second electrode 114 can be decreased. Further, luminance unevenness due to a voltage drop caused by the resistance value of the second electrode 114 can be suppressed. Further, as illustrated in FIG. 1A, a plurality of portions where the conductive layer 102 is electrically connected to the second electrode 114 is provided in the emission region of the light-emitting device 150, whereby effects of decreasing the resistance value of the second electrode 114 and suppressing luminance unevenness become larger.

As the second electrode 114, a light-transmitting conductive metal oxide layer may be formed by a sputtering method, an ion plating method, a vacuum evaporation method, a cluster beam evaporation method, a laser evaporation method, or the like. As the light-transmitting conductive metal oxide layer, for example, a conductive metal oxide film such as indium oxide-tin oxide (indium tin oxide (ITO)), indium oxide-tin oxide containing silicon or silicon oxide, indium oxide-zinc oxide, or indium oxide containing tungsten oxide and zinc oxide can be used. These materials have high transmittance in a visible light range and can transmit light from the organic EL layer 112 at a high rate. Specifically, the material preferably transmits 50% or more of light, more preferably 75% or more of light in a region with a wavelength of greater than or equal to 400 nm and less than or equal to 700 nm.

It is preferable that the second electrode 114 be formed so as not to damage the EL layer 112 as much as possible. When the second electrode 114 is formed by a sputtering method, it is preferable that damage to the EL layer 112 be reduced by using a facing target sputtering method (also referred to as a mirrortron sputtering method) or the like.

Note that after the second electrode 114 is formed, a protective layer covering the second electrode 114 may be formed. By the formation of protective film, deterioration of the EL layer 112 can be suppressed, and thus the reliability of the light-emitting device 150 can be increased. As the protective film, for example, a single layer or a stacked layer of a film having low water vapor permeability of silicon oxide, silicon nitride, silicon oxynitride, silicon nitride oxide, aluminum oxide, or the like is preferably formed by a known method, e.g., a sputtering method or a variety of evaporation methods such as a vacuum evaporation method.

Through the above steps, a light-emitting device in which generation of luminance unevenness due to a voltage drop and a decrease in emission luminance due to an auxiliary wiring are suppressed can be provided.

Further, the insulating substrate 100 may be bonded to the sealing substrate with a sealing material provided so as to surround the EL layer 112. Accordingly, entry of moisture and oxygen from the outside can be effectively suppressed, whereby a light-emitting element having a long lifetime can be manufactured.

The sealing material may be formed, for example, by a printing method using any of a variety of printing machines such as a flexible printing machine, an offset printing machine, a gravure printing machine, a screen printing machine, an inkjet machine, and a dispenser, and curing treatment may performed thereon as appropriate. As a material for the sealing material, any of a variety of curable adhesives, for example, a photo-curable adhesive such as a UV curable adhesive, a reactive curable adhesive, a thermosetting adhesive, and an anaerobic adhesive may be used. In view of productivity and the influence on various materials used for the light-emitting device 150, a photo-curable adhesive which does not need cure treatment under a high temperature condition and is cured in a short time, is preferably used. Further, the sealing material may include a spacer material.

For the sealing substrate, the same material as that of the insulating substrate 100 can be used A light-transmitting material is preferably used for the sealing substrate because light emission from the EL layer 112 is emitted outside from the sealing substrate side. Specifically, the sealing substrate preferably has a light transmittance of 70% or more, more preferably 85% or more in a region with a wavelength of greater than or equal to 400 nm and less than or equal to 700 nm.

With the use of a plastic substrate as the sealing substrate, the light-emitting device 150 can be reduced in thickness and weight. Further, with the use of plastic substrates as both the insulating substrate 100 and the sealing substrate, the light-emitting device 150 can have flexibility, so that the light-emitting device can have a higher added value.

Note that when the plastic substrate is used as the sealing substrate, pressure bonding may be performed while plastic outside the formation region of the EL layer 112 is heated; thus, the insulating substrate 100 and the sealing substrate may be sealed by welding.

The method for bonding the insulating substrate 100 and the sealing substrate is just an example, and the bonding may be performed by a known technique as appropriate.

Although there is no particular limitation on the thickness of the sealing substrate, it is preferable that the thickness be less than or equal to 3 mm, further preferably less than or equal to 1 mm for a reduction in thickness and weight of the light-emitting device.

As an example, an aluminosilicate glass with a thickness of 0.7 mm may be used as the sealing substrate.

Note that the bonding of the insulating substrate 100 and the sealing substrate is preferably performed in a reduced pressure or in an inert gas atmosphere such as a nitrogen atmosphere. Accordingly, a space surrounded by the insulating substrate 100, the sealing material, and the sealing substrate is in a reduced pressure or is filled with an inert gas, so that the deterioration of the EL layer 112 can be suppressed.

Through the above steps, the light-emitting device 150 having a top-emission structure according to one embodiment of the disclosed invention can be formed.

<Effect of Light-Emitting Device in this Embodiment>

In the light-emitting device 150 having a top-emission structure disclosed in this embodiment, the conductive layer 102 serving as an auxiliary wiring is formed in a large area under the first electrode 106, and the conductive layer 102 and the second electrode 114 are connected (electrically connected) in part of the second opening 111; thus, the conductive layer 102 does not block light emission from the EL layer 112. Therefore, with the formation of the auxiliary wiring, a decrease in emission luminance can be suppressed.

Further, a plurality of electrical connections between the conductive layer 102 and the second electrode 114 is formed in the emission region (e.g., a plurality of electrical connections each of which is extremely small in size is formed in the substrate surface as illustrated in FIG. 1A), so that the resistance value can be reduced in the entire second electrode 114 and thus generation of luminance unevenness due to a voltage drop can be suppressed.

Note that by the formation of the EL layer 112 over the deposition target substrate 130 in a state where the deposition target substrate 130 is inclined to the evaporation source 410, the second insulating layer 110 serves as a mask and a region where the conductive layer 102 is exposed is formed in part of the second opening 111 in a self-aligned manner. The second electrode is formed over the EL layer 112, so that the conductive layer and the second electrode can be electrically connected to each other without a complicated step such as patterning treatment. As a result, a light-emitting device in which a decrease in emission luminance and generation of luminance unevenness are suppressed can be manufactured simply and easily.

Embodiment 2

In this embodiment, a light-emitting device whose structure is partially different from that of the light-emitting device manufactured in Embodiment 1 and a method for manufacturing the light-emitting device will be described with reference to FIGS. 7A to 7C and FIGS. 8A and 8B. In the structure of this embodiment described below, the same portions or portions having similar functions are denoted by the same reference numerals in different drawings, in Embodiment 1, and the description thereof is not repeated.

<Structure of Light-Emitting Device in this Embodiment>

FIGS. 7A to 7C illustrate a top-emission light-emitting device that is an example of a light-emitting device of this embodiment. FIG. 7A is a top view of a light-emitting device 750, and FIG. 7B is an enlarged view of a portion J squarely surrounded by a dotted line in FIG. 7A. In FIG. 7B, some of components are omitted to avoid complexity.

FIG. 7C is a cross-sectional view of the light-emitting device 750 taken along dashed-dotted line G1-G2 in FIG. 7B.

The structure of the top-emission light-emitting device 750 described in this embodiment is different from that of the light-emitting device 150 described in Embodiment 1 in that a conductive substrate 700 is used instead of the insulating substrate 100, the conductive layer 102 is not used, and the conductive substrate 700 serves as an auxiliary wiring of the second electrode 114.

<Method for Manufacturing Light-Emitting Device in this Embodiment>

A method for manufacturing the light-emitting device in this embodiment is described below with reference to FIGS. 8A and 8B.

Figure 8A:
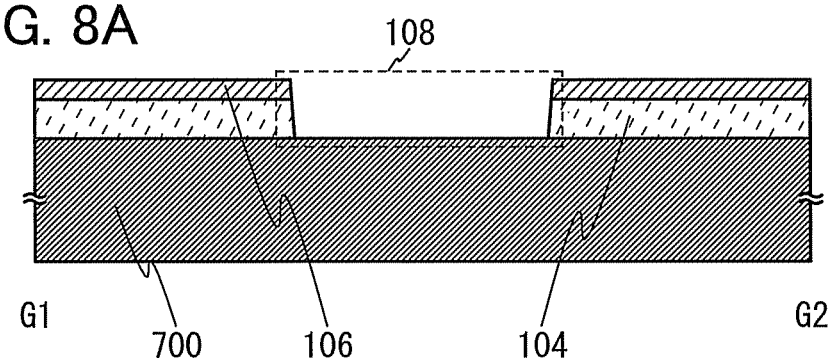
FIGS. 8A and 8B illustrate a method for manufacturing the light-emitting device described in Embodiment 2.

First, the conductive substrate 700 is prepared; the first insulating layer 104 and the first electrode 106 are formed over the conductive substrate 700; and the first opening 108 is formed in the first insulating layer 104 and the first electrode 106 (see FIG. 8A).

As the conductive substrate 700, for example, a metal substrate such as a stainless steel substrate, an aluminum substrate, an aluminum bronze substrate, a titanium substrate, a copper substrate, an iron substrate, a carbon steel substrate, a chromium steel substrate, a nickel steel substrate, a chromium nickel steel substrate, a silicon steel substrate, a tungsten steel substrate, or a manganese steel substrate, or the like, can be used. Note that the conductive substrate 700 is preferably formed using a material having thermal conductivity of greater than or equal to $10 \text{W} \cdot \text{m}^{-1} \cdot \text{K}^{-1}$. More preferably, a material having thermal conductivity of greater than or equal to $50 \text{ W} \cdot \text{m}^{-1} \cdot \text{K}^{-1}$ is used.

With the use of such a conductive substrate 700 having high thermal conductivity, heat generated in the light-emitting device 750 such as heat from the organic EL layer 112 when the light-emitting device 750 is operated, can be efficiently released to the outside through the conductive substrate 700. Thus, deterioration of the EL layer 112 (e.g., crystallization of an organic material contained in the EL layer 112 due to heat) can be suppressed, so that the light-emitting device 750 can have a long lifetime.

Note that the first insulating layer 104 and the first electrode 106 may be formed using the method and the material described in Embodiment 1.

As an example, a stainless steel substrate is used as the conductive substrate 700, a layer of silicon oxide with a thickness of 150 nm is formed over the stainless steel substrate by a plasma CVD method, and a layer of an alloy of aluminum and titanium with a thickness of 100 nm and a layer of titanium with a thickness of 10 nm are formed in this order over the layer of silicon oxide by a sputtering method. After that, parts of the layer of titanium, the layer of alloy of aluminum and titanium, and the layer of silicon oxide are selectively removed by a dry etching method using a resist mask to form the first opening 108, whereby the first insulating layer 104 and the first electrode 106 may be formed.

Figure 8B:
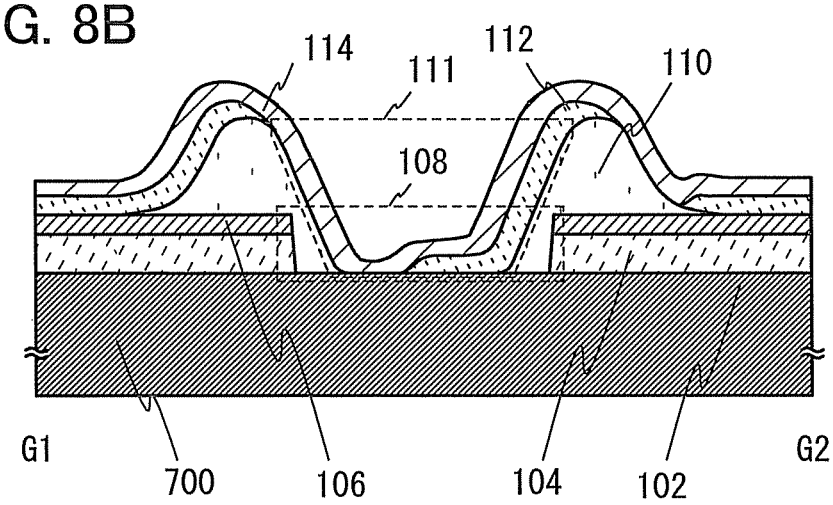

As for the following steps, the second insulating layer 110, the EL layer 112, and the second electrode 114 are formed by the method similar to that described in Embodiment 1, so that a light-emitting device can be manufactured (see FIG. 8B).

<Effect of Light-Emitting Device in this Embodiment>

In the light-emitting device 750 having a top-emission structure disclosed in this embodiment, the conductive substrate 700 is used as an auxiliary wiring, and the conductive substrate 700 and the second electrode 114 are connected (electrically connected) in part of the second opening 111; thus, the conductive substrate 700 serving as an auxiliary wiring does not block the light emission from the EL layer 112. Therefore, a decrease in emission luminance can be suppressed.

Further, a plurality of electrical connections between the conductive substrate 700 and the second electrode 114 is formed in the emission region (e.g., a plurality of electrical connections each of which is extremely small in size is formed in the substrate surface as illustrated in FIG. 7A), so that the resistance value can be reduced in the entire second electrode 114 and thus generation of luminance unevenness due to a voltage drop can be suppressed.

By the formation of the EL layer 112 over the deposition target substrate 130 in a state where the deposition target substrate 130 is inclined to the evaporation source 410, the second insulating layer 110 serves as a mask and a region where the conductive layer 102 is exposed is formed in part of the second opening 111 in a self-aligned manner. The second electrode is formed over the EL layer 112, so that the conductive layer and the second electrode can be electrically connected to each other without a complicated step such as patterning treatment. As a result, a light-emitting device in which a decrease in emission luminance and generation of luminance unevenness are suppressed can be manufactured simply and easily.

In addition, with the use of a material having high thermal conductivity such as a metal substrate or the like as the conductive substrate 700, heat generated in the light-emitting device 750 can be efficiently released to the outside. Thus, deterioration of the light-emitting device due to a thermal factor can be suppressed. Specifically, deterioration of the EL layer 112 (e.g., crystallization of an organic material contained in the EL layer 112 due to heat) can be suppressed, so that the light-emitting device 750 can have a long lifetime.

Embodiment 3

In this embodiment, an example of the EL layer 112 which can be applied to one embodiment of the present invention will be described with reference to FIGS. 9A to 9C.

Figure 9A:
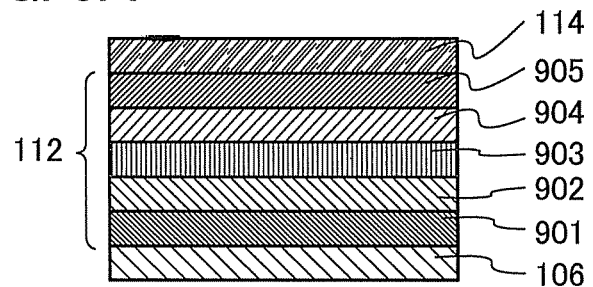
FIGS. 9A to 9C illustrate EL layers.

As illustrated in FIG. 9A, the EL layer 112 is provided between the first electrode 106 and a second electrode 114. The first electrode 106 and the second electrode 114 can have structures similar to those in the above embodiments.

The EL layer 112 includes at least a light-emitting layer containing a light-emitting organic compound. In addition, the EL layer 112 can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate. The EL layer 112 illustrated in FIG. 9A includes a hole-injection layer 901, a hole-transport layer 902, a light-emitting layer 903, an electron-transport layer 904, and an electron-injection layer 905. Note that the stacking order may be inversed.

A method for manufacturing the light-emitting element illustrated in FIG. 9A will be described.

First, the hole-injection layer 901 is formed. The hole-injection layer 901 is a layer containing a substance having a high hole-injection property. As the substance having a high hole-injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as phthalocyanine (abbreviation: $H_2Pc$), or copper(II) phthalocyanine (abbreviation: CuPc) can also be used.

Further, any of the following aromatic amine compounds which are low molecular organic compounds can be used: 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Alternatively, any of high molecular compounds (e.g., oligomers, dendrimers, or polymers) can be used. For example, any of the following high molecular compounds can be used: poly(N-vinylcarbazole) (abbreviation: PVK), poly(-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD). Further, a high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), may be used.

In particular, for the hole-injection layer 901, a composite material in which an acceptor substance (also referred to as an electron acceptor) is added to an organic compound having a high hole-transport property is preferably used. Note that by the use of the composite material in which an acceptor substance is added to the organic compound having a high hole-transport property, hole injection from the first electrode 106 is facilitated, which leads to a reduction in the drive voltage of the light-emitting element. Such a composite material can be formed by co-depositing a substance having a high hole-transport property and an acceptor substance. The hole-injection layer 901 is formed using the composite material, whereby hole injection from the first electrode 106 to the EL layer 112 is facilitated.

As the organic compound for the composite material, various compounds such as an aromatic amine compound, carbazole derivatives, aromatic hydrocarbon, and a high molecular compound (such as oligomer, dendrimer, or polymer) can be used. The organic compound used for the composite material is preferably an organic compound having a high hole-transport property. Specifically, a substance having a hole mobility of $10^{-6}$ cm$^2$/Vs or higher is preferably used. However, other substances may also be used as long as the substances have higher hole-transport properties than electron-transport properties. The organic compounds which can be used for the composite material will be specifically shown below.

Examples of the organic compounds that can be used for the composite material include: aromatic amine compounds such as TDATA, MTDATA, DPAB, DNTPD, DPA3B, PCz-PCA1, PCzPCA2, PCzPCN1, 4,4'-bis[N-(1-naphthyl)-N-phenylamino]biphenyl (abbreviation: NPB or α-NPD), and N,N'-bis(3-methylphenyl)-N,N'-diphenyl-[1,1'-biphenyl]-4,4'-diamine (abbreviation: TPD) 4-phenyl-4'-(9-phenylfluoren-9-yl)triphenylamine (abbreviation: BPAFLP); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

In addition, it is possible to use any of the following aromatic hydrocarbon compounds: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene Further alternatively, any of the following aromatic hydrocarbon compounds may be used: 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl)phenyl]anthracene (abbreviation: DPVPA).

As a substance having an acceptor property, organic compounds such as 7,7,8,8-tetracyano-2,3,5,6-tetrafluoroquinodimethane (abbreviation: F$_4$-TCNQ) and chloranil, and a transition metal oxide can be given. In addition, oxides of metals belonging to Groups 4 to 8 in the periodic table can be also given. Specifically, vanadium oxide, niobium oxide, tantalum oxide, chromium oxide, molybdenum oxide, tungsten oxide, manganese oxide, rhenium oxide, or the like is a preferable material since an acceptor property (an electron-accepting property) is high. Among these, molybdenum oxide is especially preferable since it is stable in the air, has a low hygroscopic property, and is easily handled.

Further, the hole-injection layer 901 may be formed using a composite material of the above-described high molecular compound such as PVK, PVTPA, PTPDMA, or Poly-TPD, and the above-described acceptor substance.

Next, a hole-transport layer 902 is formed over the hole-injection layer 211. The hole-transport layer 902 includes a substance having a high hole-transport property. As the substance having a high hole-transport property, any of the following aromatic amine compounds can be used, for example: NPB; TPD; BPAFLP; 4,4'-bis[N-(9,9-dimethylfluoren-2-yl)-N-phenylamino]biphenyl (abbreviation: DFLDPBi); and 4,4'-bis[N-(Spiro-9,9'-bifluoren-2-yl)-N-phenylamino]biphenyl (abbreviation: BSPB). The substances mentioned here are mainly ones that have a hole mobility of $10^{-6}$ cm$^2$/Vs or higher. However, another substance may also be used as long as the substance has a higher hole-transport property than an electron-transport property. The layer containing a substance with a high hole-transport property is not limited to a single layer, and two or more layers containing the aforementioned substances may be stacked.

For the hole-transport layer 902, a carbazole derivative such as CBP, CzPA, or PCzPA or an anthracene derivative such as t-BuDNA, DNA, or DPAnth may be used.

Alternatively, for the hole-transport layer 902, a high molecular compound such as PVK, PVTPA, PTPDMA, or Poly-TPD can be used.

Next, the light-emitting layer 903 is formed over the hole-transport layer 902. As the light-emitting layer 903, for example, a fluorescent compound which exhibits fluorescence or a phosphorescent compound which exhibits phosphorescence can be used.

The fluorescent compounds that can be used for the light-emitting layer 903 will be given. Examples of a material for blue light emission include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl)triphenylamine (abbreviation: PCBAPA). Further, examples of a material for green light emission include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA). Examples of a material for yellow light emission include rubrene and 5,12-bis(1,1'-biphenyl-4-yl)-6,11-diphenyltetracene (abbreviation: BPT). Examples of a material for red light emission include N,N,N',N'-tetrakis(4-methylphenyl)tetracene-5,11-diamine (abbreviation: p-mPhTD), and 7,14-diphenyl-N,N, N',N'-tetrakis(4-methylphenyl)acenaphtho[1,2-a]fluoranthene-3,10-diamine (abbreviation: p-mPhAFD).

The phosphorescent compounds that can be used for the light-emitting layer 703 will be given. Examples of a material for blue light emission include bis[2-(4',6'-difluorophenyl) pyridinato-N,$C^{2'}$] iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium (III) picolinate (abbreviation: Ir(CF$_3$ppy)$_2$(pic)), and bis[2-(4',6'-difluorophenyl)pyridinato-N,$C^{2'}$]iridium(III) acetylacetonate (abbreviation: FIr(acac)). Examples of a material for green light emission include tris(2-phenylpyridinato-N,$C^{2'}$)iridium(III) (abbreviation: Ir(ppy)$_3$), bis(2-phenylpyridinato-N,$C^{2'}$)iridium(III)acetylacetonate (abbreviation: Ir(ppy)$_2$(acac)), bis(1,2-diphenyl-1H-benzimidazolato) iridium(III)acetylacetonate (abbreviation: Ir(pbi)$_2$(acac)), bis (benzo[h]quinolinato)iridium(III)acetylacetonate (abbreviation: Ir(bzq)$_2$(acac)), and tris(benzo[h]quinolinato) iridium(III) (abbreviation: Ir(bzq)$_3$). Examples of a material for yellow light emission include bis(2,4-diphenyl-1,3-oxazolato-N,$C^{2'}$)iridium(III)acetylacetonate (abbreviation: Ir(dpo)$_2$(acac)), bis[2-(4'-perfluorophenylphenyl)pyridinato] iridium(III)acetylacetonate (abbreviation: Ir(p-PF-ph)$_2$ (acac)), bis(2-phenylbenzothiazolato-N,$C^{2'}$)iridium(III) acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$ (acac)), and (acetylacetonato)bis{2-(4-methoxyphenyl)-3,5-dimethylpyrazinato}iridium(III) (abbreviation: Ir(dmmoppr)$_2$(acac)). Examples of a material for orange light emission include tris(2-phenylquinolinato-N,$C^{2'}$)iridium(III) (abbreviation: Ir(pq)$_3$), bis(2-phenylquinolinato-N,$C^{2'}$)iridium(III) acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), and (acetylacetonato) bis(5-isopropyl-3-methyl-2-phenylpyrazinato)iridium(III) (abbreviation: Ir(mppr-iPr)$_2$(acac)). Examples of a material for red light emission include organometallic complexes such as bis[2-(2'-benzo[4,5-α]thienyl)pyridinato-N,$C^{3'}$]iridium (III)acetylacetonate (abbreviation: Ir(btp)$_2$(acac)), bis(1-phenylisoquinolinato-N,$C^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium (III) (abbreviation: Ir(tppr)$_2$(dpm)), and 2,3,7,8,12,13,17,18-octaethyl-21H,23H-porphyrinplatinum(II) (abbreviation: PtOEP). Further, rare-earth metal complexes, such as tris (acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)), exhibit light emission from rare-earth metal ions (electron transition between different multiplicities), and thus can be used as phosphorescent compounds.

Note that the light-emitting layer 903 may have a structure in which the above light-emitting organic compound (a guest material) is dispersed in another substance (a host material). As a host material, a variety kinds of materials can be used, and it is preferable to use a substance which has a lowest unoccupied molecular orbital level (LUMO level) higher than that of the light-emitting material and has a highest occupied molecular orbital level (HOMO level) lower than that of the light-emitting material.

Specific examples of the host material include metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato) beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato] zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), and bathocuproine (abbreviation: BCP); condensed aromatic compounds such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl) diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), and 6,12-dimethoxy-5,11-diphenylchrysene; and aromatic amine compounds such as N,N-dipheyl-9-[4-(10-phenyl-9-anthryl) phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, and BSPB.

As the host material, plural kinds of materials can be used. For example, in order to suppress crystallization, a substance such as rubrene which suppresses crystallization may be further added. In addition, NPB, Alq, or the like may be further added in order to efficiently transfer energy to the guest material.

With a structure in which a guest material is dispersed in a host material, crystallization of the light-emitting layer 903 can be suppressed. Further, concentration quenching due to high concentration of the guest material can be suppressed.

For the light-emitting layer 903, a high molecular compound can be used. Specifically, a material for blue light emission, a material for green light emission, and a material for orange to red light emission are given. Examples of a material for blue light emission include poly(9,9-dioctylfluorene-2,7-diyl) (abbreviation: PFO), poly[(9,9-dioctylfluorene-2,7-diyl-co-(2,5-dimethoxybenzene-1,4-diyl)] (abbreviation: PF-DMOP), and poly{(9,9-dioctylfluorene-2,7-diyl)-co-[N,N'-di-(p-butylphenyl)-1,4-diaminobenzene]} (abbreviation: TAB-PFH). Examples of a material for green light emission include poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), and poly[(9,9-dioctyl-2,7-divinylenfluorenylene)-alt-co-(2-methoxy-5-(2-ethylhexyloxy)-1,4-phenylene)]. Examples of a material for orange to red light emission include poly[2-methoxy-5-(2'-ethylhexoxy)-1,4-phenylenevinylene] (abbreviation: MEH-PPV), poly(3-butylthiophene-2,5-diyl)

(abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, and poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD).

Next, the electron transport layer 904 is formed over the light-emitting layer 903. The electron transport layer 904 is a layer containing a substance having a high electron transport property. As the substance having a high electron-transport property, any of the following substances can be used, for example: a metal complex having a quinoline skeleton or a benzoquinoline skeleton such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq). Alternatively, a metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here are mainly ones that have an electron mobility of $10^{-6}$ cm$^2$/V·s or higher. The electron transport layer is not necessarily a single layer and may be formed of a stack including two or more layers containing any of above substances.

Next, the electron injection layer 905 is formed over the electron transport layer 904. The electron injection layer 905 is a layer containing a substance having a high electron injection property. For the electron injection layer 905, an alkali metal, an alkaline earth metal, or a compound thereof, such as lithium, cesium, calcium, lithium fluoride, cesium fluoride, calcium fluoride, or lithium oxide, can be used. Further, a rare earth metal compound such as erbium fluoride may be used. A substance for forming the electron transport layer 904 may be used.

Note that the hole-injection layer 901, the hole-transport layer 902, the light-emitting layer 903, the electron transport layer 904, and the electron injection layer 905 which are described above can each be formed by an evaporation method (e.g., a vacuum evaporation method), an inkjet method, a coating method, or the like.

Through the above steps, the EL layer 112 shown in FIG. 9A can be obtained.

Figure 9B:
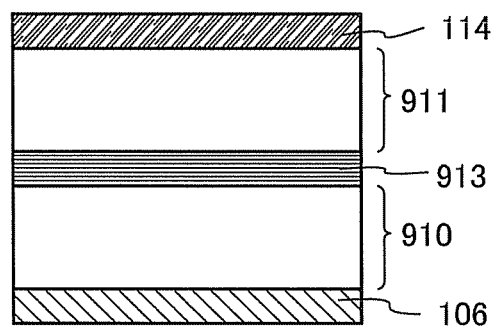

As illustrated in FIG. 9B, a plurality of EL layers 112 may be stacked between the first electrode 106 and second electrode 114. In that case, a charge generation layer 913 is preferably provided between a first EL layer 910 and a second EL layer 911 which are stacked. The charge generation layer 913 can be formed by using the above-mentioned composite material. Further, the charge generation layer 913 may have a stacked structure including a layer containing the composite material and a layer containing another material. In that case, as the layer containing another material, a layer containing an electron donating substance and a substance having a high electron transport property, a layer fowled of a transparent conductive film, or the like can be used. As for a light-emitting element having such a structure, problems such as energy transfer and quenching are less likely to occur, and thus a light-emitting element which has both high emission efficiency and long lifetime can be easily obtained due to expansion in the choice of materials. Moreover, a light-emitting element which provides phosphorescence from one of the EL layers and fluorescence from the other can be readily obtained. Note that this structure can be combined with any of the above structures of the EL layer 112.

Figure 9C:
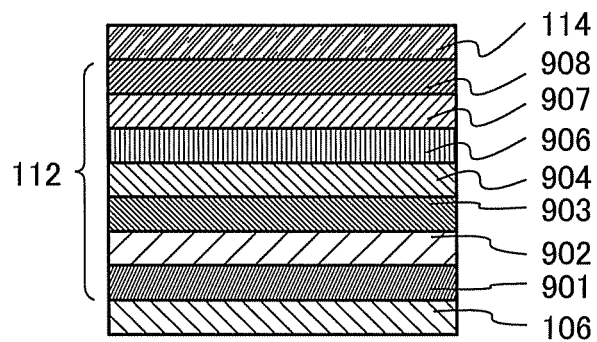

As illustrated in FIG. 9C, the EL layer 112 may include the hole-injection layer 901, the hole-transport layer 902, the light-emitting layer 903, the electron transport layer 904, an electron injection buffer layer 906, an electron relay layer 907, and a composite material layer 908, between the first electrode 106 and the second electrode 114.

It is preferable to provide the composite material layer 908, in which case damage caused to the EL layer 112 particularly when the second electrode 114 is formed by a sputtering method can be reduced. The composite material layer 908 can be formed using the above composite material in which an organic compound having a high hole-transport property is mixed with an acceptor substance.

Further, by providing the electron injection buffer layer 906, an injection barrier between the composite material layer 908 and the electron transport layer 904 can be reduced; thus, electrons generated in the composite material layer 908 can be easily injected to the electron transport layer 904.

Any of the following substances having a high electron injection property can be used for the electron injection buffer layer 906: an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), a rare earth metal compound (e.g., an oxide, a halide, and a carbonate)), and the like.

Further, in the case where the electron injection buffer layer 906 contains a substance having a high electron transport property and a donor substance, the donor substance is preferably added so that the mass ratio of the donor substance to the substance having a high electron transport property is from 0.001:1 to 0.1:1. Note that as the donor substance, an organic compound such as tetrathianaphthacene (abbreviation: TTN), nickelocene, or decamethylnickelocene may be used as well as an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), and a rare earth metal compound (e.g., an oxide, a halide, and a carbonate)). Note that as the substance having a high electron transport property, a material similar to the material for the electron transport layer 904 described above can be used.

Furthermore, the electron relay layer 907 is preferably unwed between the electron injection buffer layer 906 and the composite material layer 908. The electron relay layer 907 is not necessarily provided; however, by providing the electron relay layer 907 having a high electron transport property, electrons can be rapidly transported to the electron injection buffer layer 906.

The structure in which the electron relay layer 907 is sandwiched between the composite material layer 908 and the electron injection buffer layer 906 is a structure in which the acceptor substance contained in the composite material layer 908 and the donor substance contained in the electron-injection buffer layer 906 are less likely to interact with each other, and thus their functions hardly interfere with each other. Accordingly, an increase in the driving voltage can be prevented.

The electron relay layer 907 contains a substance having a high electron transport property and is formed so that the LUMO level of the substance having a high electron transport property is located between the LUMO level of the acceptor substance contained in the composite material layer 908 and the LUMO level of the substance having a high electron transport property contained in the electron transport layer 904. In the case where the electron relay layer 907 contains a donor substance, the donor level of the donor substance is controlled so as to be located between the LUMO level of the acceptor substance in the composite material layer 908 and the LUMO level of the substance having a high electron transport property contained in the electron transport layer 904. As a specific value of the energy level, the LUMO level of the substance having a high electron transport property contained in the electron relay layer 907 is preferably greater than or equal to −5.0 eV, more preferably greater than or equal to −5.0 eV and less than or equal to −3.0 eV.

As the substance having a high electron transport property contained in the electron relay layer 907, a phthalocyanine-based material or a metal complex having a metal-oxygen bond and an aromatic ligand is preferably used.

As the phthalocyanine-based material contained in the electron relay layer 907, specifically, any of the following is preferably used: CuPc, a phthalocyanine tin(II) complex (SnPc), a phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc).

As the metal complex having a metal-oxygen bond and an aromatic ligand, which is contained in the electron relay layer 907, a metal complex having a metal-oxygen double bond is preferably used. The metal-oxygen double bond has an acceptor property (a property of easily accepting electrons); thus, electrons can be transferred (donated and accepted) more easily. Further, the metal complex which has a metal-oxygen double bond is considered stable. Thus, the use of the metal complex having a metal-oxygen double bond makes it possible to drive the light-emitting element at low voltage more stably.

As the metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that as the phthalocyanine-based material described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent; thus, the phthalocyanine derivative has an advantage of being easily handled during formation of a light-emitting element and an advantage of facilitating maintenance of an apparatus used for film formation.

The electron relay layer 907 may further contain a donor substance. Examples of the donor substance include organic compounds such as tetrathianaphthacene (abbreviation: TTN), nickelocene, and decamethylnickelocene, in addition to an alkali metal, an alkaline earth metal, a rare earth metal, and compounds of the above metals (e.g., alkali metal compounds (including an oxide such as lithium oxide, a halide, and carbonates such as lithium carbonate and cesium carbonate), alkaline earth metal compounds (including an oxide, a halide, and a carbonate), and rare earth metal compounds (including an oxide, a halide, and a carbonate)). When such a donor substance is contained in the electron relay layer 907, electrons can be transferred easily and the light-emitting element can be driven at lower voltage.

In the case where a donor substance is contained in the electron relay layer 907, other than the materials described above as the substance having a high electron transport property, a substance having a LUMO level greater than the acceptor level of the acceptor substance contained in the composite material layer 908 may be used. As a specific energy level of the substance having a LUMO level, a LUMO level is greater than or equal to −5.0 eV, preferably greater than or equal to −5.0 eV and less than or equal to −3.0 eV. As examples of such a substance, a perylene derivative and a nitrogen-containing condensed aromatic compound can be given. Note that a nitrogen-containing condensed aromatic compound is preferably used for the electron relay layer 907 because of its stability. Among the nitrogen-containing condensed aromatic compounds, a structure in which a compound having an electron-withdrawing group such as a cyano group or a fluoro group is used is a preferable structure because electrons are easily accepted.

As specific examples of the perylene derivative, the following can be given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), and N,N'-dihexyl-3,4,9,10-perylenetetracarboxylic diimide (abbreviation: Hex PTC).

As specific examples of the nitrogen-containing condensed aromatic compound, the following can be given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), and 2,3-bis(4-fluorophenyl)pyrido[2,3-b]pyrazine (abbreviation: F2PYPR).

Other examples are 7,7,8,8-tetracyanoquinodimethane (abbreviation: TCNQ), 1,4,5,8-naphthalenetetracarboxylic-dianhydride (abbreviation: NTCDA), perfluoropentacene, copper hexadecafluoro phthalocyanine (abbreviation: F$_{16}$CuPc), N,N'-bis(2,2,3,3,4,4,5,5,6,6,7,7,8,8-pentadecafluorooctyl)-1,4,5,8-naphthalenetetracarboxylic diimide (abbreviation: NTCDI-C8F), 3',4'-dibutyl-5,5"-bis(dicyanomethylene)-5,5"-dihydro-2,2':5',2"-terthiophen (abbreviation: DCMT), and methanofullerene (e.g., [6,6]-phenyl C$_{61}$ butyric acid methyl ester).

Note that in the case where a donor substance is contained in the electron relay layer 907, the electron relay layer 907 may be found by a method such as co-evaporation of the substance having a high electron transport property and the donor substance.

The hole-injection layer 901, the hole-transport layer 902, the light-emitting layer 903, and the electron transport layer 904 may each be formed using any of the above materials.

This embodiment can be combined with any of the other embodiments disclosed in this specification as appropriate.

Embodiment 4

Figure 10:
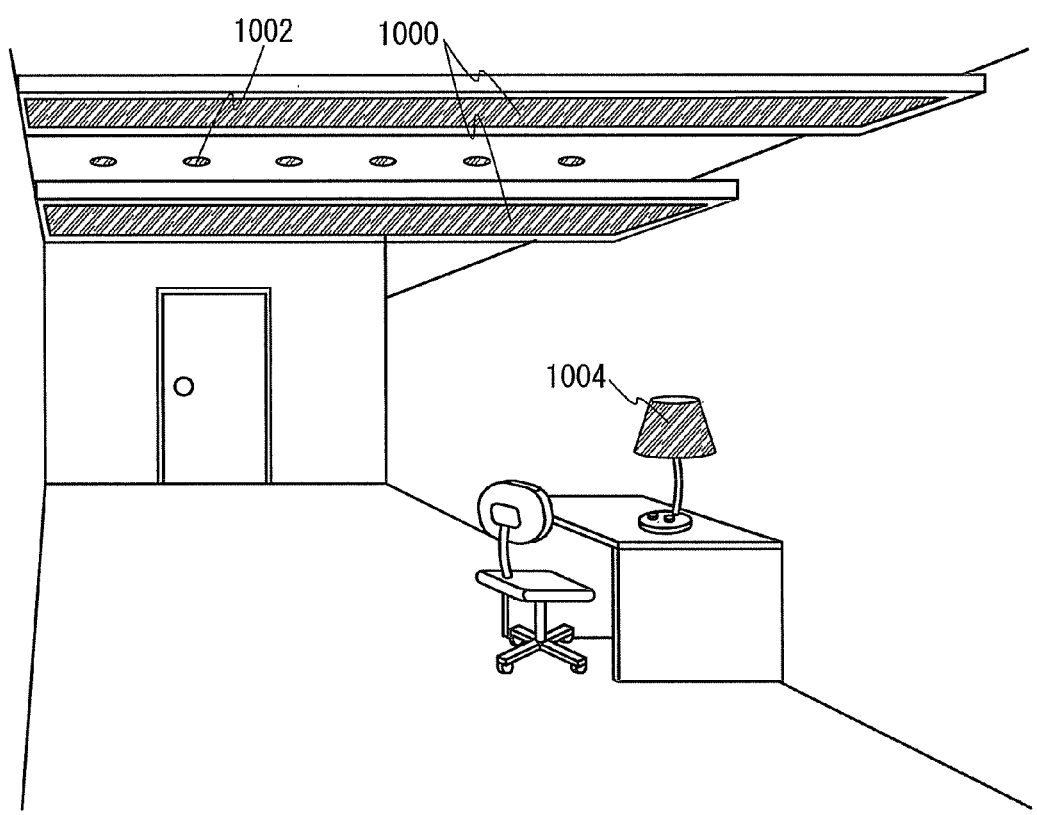
FIG. 10 illustrates lighting devices each including a light-emitting device according to the present invention.

The light-emitting device disclosed in this specification can be applied to a lighting device. For example, when attached to a ceiling or a wall, the light-emitting devices disclosed in this specification can be used as a lighting device 1000 and a lighting device 1002 as illustrated in FIG. 10.

As the lighting device 1000, the light-emitting device disclosed in this specification is attached to a ceiling surface for the purpose of illuminating the whole room brightly. In the light-emitting device disclosed in this specification, a decrease in emission luminance due to an auxiliary wiring and generation of luminance unevenness due to a voltage drop are suppressed, so that the whole room can be brightly illuminated with low power consumption. Further, replacement frequency can be reduced with the use of the light-emitting device described in Embodiment 2, whereby the burden on a user can be reduced.

As the lighting device 1002, the light-emitting device disclosed in this specification is attached to the inside of hemispherical recesses formed in the ceiling for the purpose of using the light-emitting device as a spotlight partially illuminating the room brightly. In the light-emitting device 150 (or the light-emitting device 750) disclosed in this specification, the insulating substrate 100 (or the conductive substrate 700) and the sealing substrate are each formed using a flexible substrate such as a plastic substrate, a metal substrate, or the like. Thus, the light-emitting device 150 (or the light-emitting device 750) can be attached to a curved surface or the like; therefore, it can be used for lighting devices having a variety of shapes and use applications.

For example, the light-emitting device disclosed in this specification can be attached to a curved surface and used as a desk lamp 1004. In illumination used close to human eyes as the desk lamp 1004, luminance unevenness is highly visible; however, luminance unevenness can be suppressed in the light-emitting device disclosed in this specification; thus, the light-emitting device is suitable for lighting devices used close to human eyes.

This application is based on Japanese Patent Application serial no. 2011-086496 filed with Japan Patent Office on Apr. 8, 2011, the entire contents of which are hereby incorporated by reference.

What is claimed is:

1. A light-emitting device comprising:
   a substrate;
   a conductive layer over the substrate;
   a first insulating layer over the conductive layer;
   a first electrode over the first insulating layer;
   an opening in the first electrode and the first insulating layer, wherein the first electrode is physically isolated from the conductive layer in the opening;
   a second insulating layer covering a side surface of the opening and a part of the first electrode;
   a light-emitting layer over the first electrode and the second insulating layer, the light-emitting layer being electrically connected to the first electrode; and
   a second electrode over the light-emitting layer and the second insulating layer, the second electrode being physically connected to the conductive layer in the opening.

2. The light-emitting device according to claim 1, wherein the substrate is an insulating substrate.

3. The light-emitting device according to claim 1, wherein the light-emitting layer includes a light-emitting organic compound.

4. The light-emitting device according to claim 1, wherein the first insulating layer includes a material selected from silicon oxide, silicon nitride, silicon oxynitride, silicon nitride oxide, aluminum oxide, aluminum nitride, aluminum oxynitride, and aluminum nitride oxide.

5. The light-emitting device according to claim 1, wherein the second insulating layer includes an insulating organic resin.

6. The light-emitting device according to claim 1, wherein the second insulating layer includes a resin selected from an acrylic resin, a polyimide resin, a polyamide resin, a polyamide-imide resin, and an epoxy resin.

7. A light-emitting device comprising:
   a conductive substrate;
   a first insulating layer over the conductive substrate;
   a first electrode over the first insulating layer;
   a first an opening in the first electrode and the first insulating layer, wherein the first electrode is physically isolated from the conductive substrate in the opening;
   a second insulating layer covering a side surface of the opening and a part of the first electrode;
   a light-emitting layer over the first electrode and the second insulating layer, the light-emitting layer being electrically connected to the first electrode;
   a second electrode over the light-emitting layer and the second insulating layer, the second electrode being physically connected to the conductive substrate in the opening.

8. The light-emitting device according to claim 7, wherein the light-emitting layer includes a light-emitting organic compound.

9. The light-emitting device according to claim 7, wherein the first insulating layer includes a material selected from silicon oxide, silicon nitride, silicon oxynitride, silicon nitride oxide, aluminum oxide, aluminum nitride, aluminum oxynitride, and aluminum nitride oxide.

10. The light-emitting device according to claim 7, wherein the second insulating layer includes an insulating organic resin.

11. The light-emitting device according to claim 7, wherein the second insulating layer includes a resin selected from an acrylic resin, a polyimide resin, a polyamide resin, a polyamide-imide resin and an epoxy resin.

12. A method for manufacturing a light-emitting device comprising the steps of:
    forming a conductive layer over a substrate;
    forming a first insulating layer over the conductive layer;
    forming a first electrode over the first insulating layer;
    forming an opening in the first electrode and the first insulating layer thereby exposing the conductive layer in the opening;
    forming a second insulating layer to cover a side surface of the opening and a part of the first electrode so that a part of an exposed portion of the conductive layer remains exposed in the opening;
    forming a light-emitting layer over the second insulating layer and the first electrode; and
    forming a second electrode over the light-emitting layer and the second insulating layer so that the second electrode is physically connected to the conductive layer in the opening.

13. The method for manufacturing a light-emitting device according to claim 12, wherein the substrate is an insulating substrate.

14. The method for manufacturing a light-emitting device according to claim 12, wherein the light-emitting layer includes a light-emitting organic compound.

15. The method for manufacturing a light-emitting device according to claim 12, wherein the first insulating layer includes a material selected from silicon oxide, silicon nitride, silicon oxynitride, silicon nitride oxide, aluminum oxide, aluminum nitride, aluminum oxynitride, and aluminum nitride oxide.

16. The method for manufacturing a light-emitting device according to claim 12, wherein the second insulating layer includes an insulating organic resin.

17. The method for manufacturing a light-emitting device according to claim 12, wherein the second insulating layer includes a resin selected from an acrylic resin, a polyimide resin, a polyamide resin, a polyamide-imide resin, and an epoxy resin.

18. The method for manufacturing a light-emitting device according to claim 12, wherein the substrate is inclined to an evaporation source during the step of forming the light-emitting layer.

19. The light-emitting device according to claim 1, wherein the second insulating layer is in contact with the conductive layer in the opening.

20. The light-emitting device according to claim 1, wherein the second insulating layer is in contact with a side surface of the first insulating layer in the opening.

21. The light-emitting device according to claim 7, wherein the second insulating layer is in contact with the conductive substrate in the opening.

22. The light-emitting device according to claim 7, wherein the second insulating layer is in contact with a side surface of the first insulating layer in the opening.

23. The method according to claim 12, wherein the second insulating layer is formed so as to be in contact with the conductive layer in the opening.

24. The method according to claim 12, wherein the second insulating layer is formed so as to be in contact with a side surface of the first insulating layer in the opening.

\* \* \* \* \*